United States Patent
Georgis

(10) Patent No.: US 11,727,651 B2
(45) Date of Patent: Aug. 15, 2023

(54) HYBRID EDGE-CLOUD COMPRESSION OF VOLUMETRIC 3D DATA FOR EFFICIENT 5G TRANSMISSION

(71) Applicant: SONY GROUP CORPORATION, Tokyo (JP)

(72) Inventor: Nikolaos Georgis, San Diego, CA (US)

(73) Assignee: SONY GROUP CORPORATION, Tokyo (JP)

( * ) Notice: Subject to any disclaimer, the term of this patent is extended or adjusted under 35 U.S.C. 154(b) by 171 days.

(21) Appl. No.: 17/235,255

(22) Filed: Apr. 20, 2021

(65) Prior Publication Data

US 2022/0114790 A1 Apr. 14, 2022

Related U.S. Application Data

(60) Provisional application No. 63/090,338, filed on Oct. 12, 2020.

(51) Int. Cl.
*G06T 19/00* (2011.01)
*H03M 7/30* (2006.01)
*G06T 7/62* (2017.01)
*G06T 9/00* (2006.01)

(52) U.S. Cl.
CPC .............. *G06T 19/006* (2013.01); *G06T 7/62* (2017.01); *G06T 9/001* (2013.01); *H03M 7/3059* (2013.01); *G06T 2207/10028* (2013.01)

(58) Field of Classification Search
CPC ......... G06T 19/006; G06T 7/62; G06T 9/001; G06T 2207/10028; H03M 7/3059; H03M 7/6047; H03M 7/70
See application file for complete search history.

(56) References Cited

U.S. PATENT DOCUMENTS

| | | | |
|---|---|---|---|
| 2020/0374974 A1* | 11/2020 | Sun | H04L 41/20 |
| 2021/0096996 A1* | 4/2021 | Jalaparti | H04L 67/1097 |
| 2022/0067046 A1* | 3/2022 | Katroulis | G06F 11/3419 |
| 2022/0076447 A1* | 3/2022 | He | G06V 10/457 |

FOREIGN PATENT DOCUMENTS

| | | |
|---|---|---|
| CN | 105049838 A | 11/2015 |
| EP | 2932486 A1 | 10/2015 |

OTHER PUBLICATIONS

Anna Qingfeng Li et al., "White Paper: a 3D Volumetric VOD Capture and Stream Solution for Public Cloud" Intel Corporation, Aug. 25, 2020.

* cited by examiner

*Primary Examiner* — Chong Wu
(74) *Attorney, Agent, or Firm* — Haverstock & Owens, A Law Corporation

(57) ABSTRACT

A hybrid implementation enables sharing the processing of 3D data locally and remotely based on processing and bandwidth factors. The hybrid implementation is flexible in determining what information to process locally, what information to transmit to a remote system, and what information to process remotely. Based on the available bandwidth, computing power/availability locally and computing power/availability remotely, the hybrid implementation is able to direct the processing of the data. By performing some of the processing locally and some of the processing remotely, more efficient processing is able to be implemented.

20 Claims, 9 Drawing Sheets

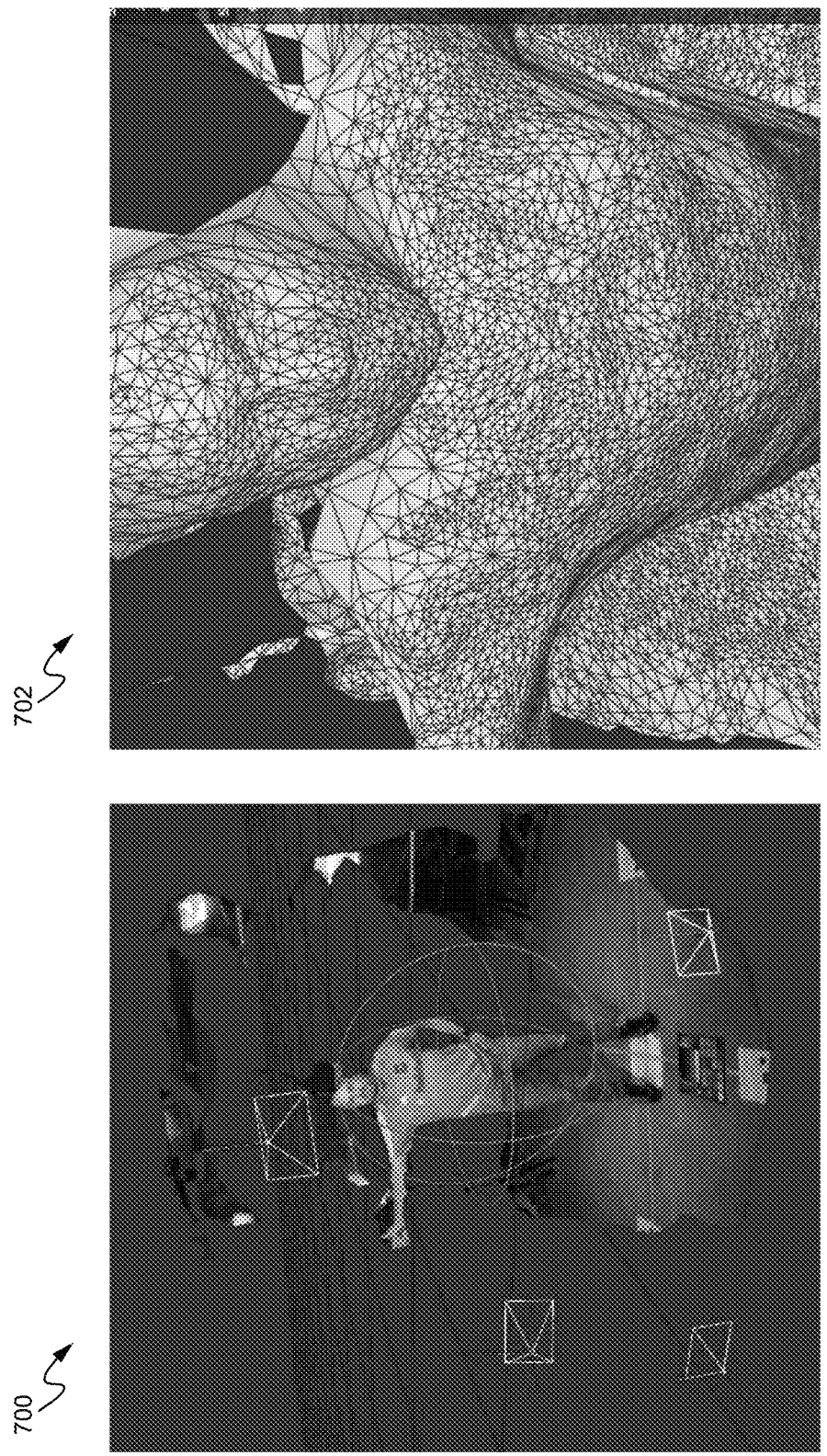

HYBRID EDGE-CLOUD COMPRESSION OF VOLUMETRIC 3D DATA FOR EFFICIENT 5G TRANSMISSION

CROSS-REFERENCE TO RELATED APPLICATION(S)

This application claims priority under 35 U.S.C. § 119(e) of the U.S. Provisional Patent Application Ser. No. 63/090,338, filed Oct. 12, 2020 and titled, "HYBRID EDGE-CLOUD COMPRESSION OF VOLUMETRIC 3D DATA FOR EFFICIENT 5G TRANSMISSION," which is hereby incorporated by reference in its entirety for all purposes.

FIELD OF THE INVENTION

The present invention relates to three dimensional graphics. More specifically, the present invention relates to compression of three dimensional graphics.

BACKGROUND OF THE INVENTION

A $5^{th}$ generation mobile network is being developed, referred to as 5G. The 5G network is designed to connect virtually everyone and everything together including device and machines not previously connected. The 5G network, like any network, can only handle a limited amount of data. Thus, sending large amounts of data over the network could lead to issues.

Typically, volumetric studios merely capture images from cameras and send large amounts of data to remote storage for remote processing.

SUMMARY OF THE INVENTION

A hybrid implementation enables sharing the processing of 3D data locally and remotely based on processing and bandwidth factors. The hybrid implementation is flexible in determining what information to process locally, what information to transmit to a remote system, and what information to process remotely. Based on the available bandwidth, computing power/availability locally and computing power/availability remotely, the hybrid implementation is able to direct the processing of the data. By performing some of the processing locally and some of the processing remotely, more efficient processing is able to be implemented.

In one aspect, a method comprises acquiring volumetric 3D data with a plurality of camera devices, processing a first portion of the volumetric 3D data with a local device, analyzing a first set of load information of the local device, a second set of load information of a remote device, and network bandwidth information, processing a second portion of the volumetric 3D data with a remote device based on the analysis of the first set of load information of the local device, the second set of load information of the remote device, and the network bandwidth information. Processing the volumetric 3D data comprises at least one of feature extraction, depth map generation, mesh generation, structure from motion generation, and texturing. Processing the first portion of the volumetric 3D data with the local device and processing the second portion of the volumetric 3D data with the remote device utilizes pipelining. The method further comprises determining when to send the second portion of the volumetric 3D data and accompanying data to the remote device using artificial intelligence. Determining when to send the second portion of the volumetric 3D data and the accompanying data is based on the second set of load information of the remote device being greater than the first set of load information of the local device. Determining when to send the second portion of the volumetric 3D data and the accompanying data includes continuously analyzing the first set of load information of the local device, the second set of load information of the remote device, and the network bandwidth information. Determining when to send the second portion of the volumetric 3D data and the accompanying data includes analyzing the first set of load information of the local device, the second set of load information of the remote device, and the network bandwidth information after completion of a specific stage of processing the volumetric 3D data. The method further comprises implementing real-time compression of the volumetric 3D data.

In another aspect, an apparatus comprises a non-transitory memory for storing an application, the application for: processing a first portion of a volumetric 3D data, sending a second portion of the volumetric 3D data to a remote device based on analysis of a first set of load information of the apparatus, a second set of load information of the remote device, and network bandwidth information and a processor coupled to the memory, the processor configured for processing the application. The application is further configured for acquiring volumetric 3D data from a plurality of camera devices. The application is further configured for analyzing the first set of load information of the apparatus, the second set of load information of a remote device, and the network bandwidth information. Processing the first portion of the volumetric 3D data comprises at least one of feature extraction, depth map generation, mesh generation, structure from motion generation, and texturing. The application is further configured for determining when to send the second portion of the volumetric 3D data and accompanying data to the remote device using artificial intelligence. Determining when to send the second portion of the volumetric 3D data and the accompanying data is based on the second set of load information of the remote device being greater than the first set of load information of the local device. Determining when to send the second portion of the volumetric 3D data and the accompanying data includes continuously analyzing the first set of load information of the local device, the second set of load information of the remote device, and the network bandwidth information. Determining when to send the second portion of the volumetric 3D data and the accompanying data includes analyzing the first set of load information of the local device, the second set of load information of the remote device, and the network bandwidth information after completion of a specific stage of processing the volumetric 3D data. The application is further configured for implementing real-time compression of the volumetric 3D data.

In another aspect, an apparatus comprises a non-transitory memory for storing an application, the application for: receiving a portion of volumetric 3D data from a local device based on analysis of a first set of load information of the apparatus, a second set of load information of the remote device, and network bandwidth information and processing the portion of the volumetric 3D data and a processor coupled to the memory, the processor configured for processing the application. The application is further configured for analyzing the first set of load information of the apparatus, the second set of load information of a remote device, and the network bandwidth information. Processing the portion of the volumetric 3D data comprises at least one of feature extraction, depth map generation, mesh generation, structure from motion generation, and texturing.

BRIEF DESCRIPTION OF THE DRAWINGS

FIG. 7 illustrates exemplary images of a volumetric 3D capture system and mesh according to some embodiments.

DETAILED DESCRIPTION OF THE PREFERRED EMBODIMENT

Previous implementations avoided lossy compression of RGB and Bayer data before transmission due to inaccurate 3D results on the receiving end. However, the hybrid implementation enables performing local feature and depth map calculations at the edge which reduces bandwidth by transmission of up to 10:1 compressed RGB or Bayer data. Results are accurate, and volumetric 3D transmission over 5G is faster using the hybrid implementation.

Figure 1:
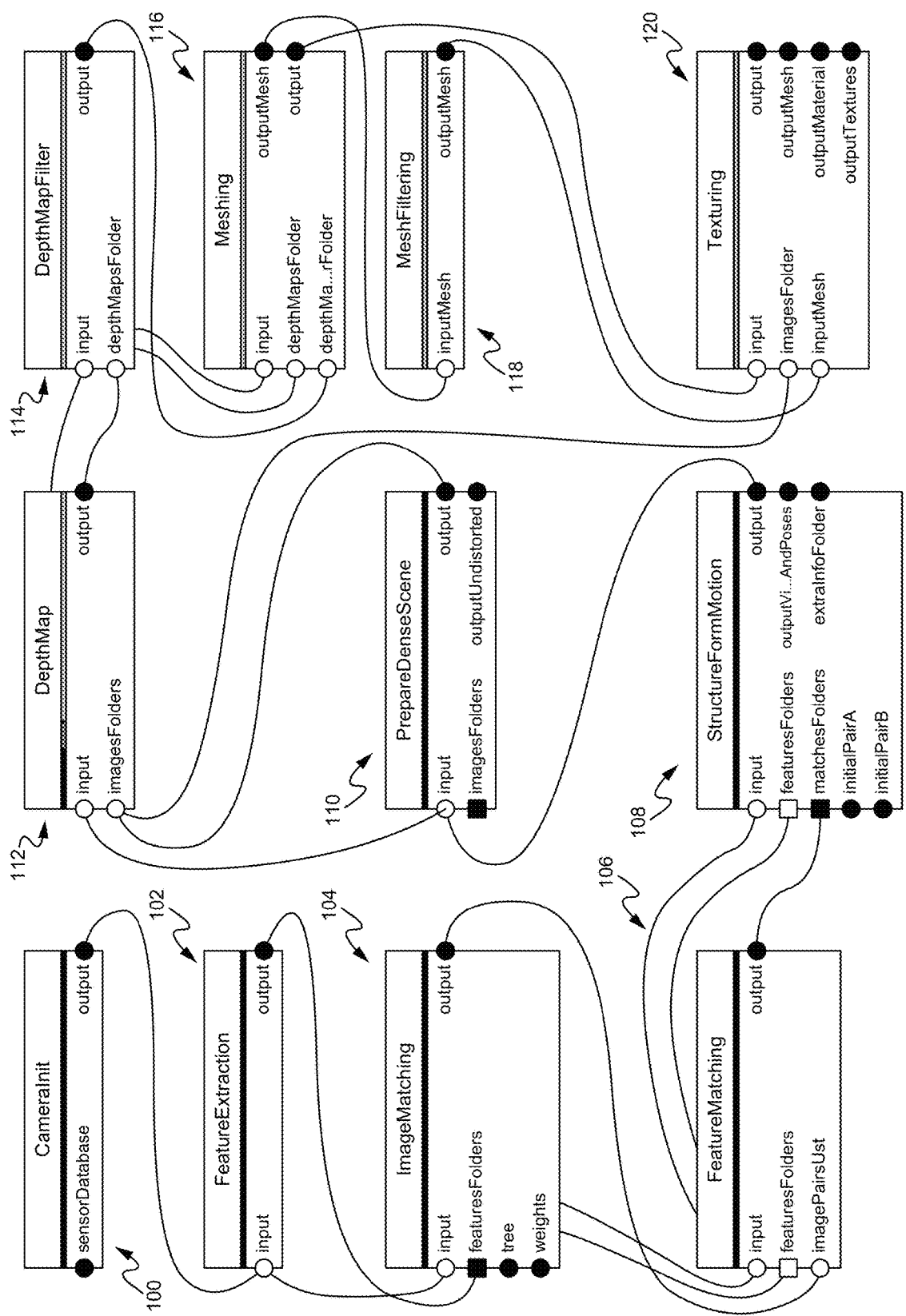
FIG. 1 illustrates a flowchart of a photogrammetry pipeline according to some embodiments.

FIG. 1 illustrates a flowchart of a photogrammetry pipeline according to some embodiments. A camera is initialized in the step 100. Typically many cameras are utilized, and thus many cameras are initialized. Feature extraction is implemented in the step 102. Feature extraction is able to be implemented in any manner such as using masking to determine and extract features, by comparison of a template, and/or any other manner. Image matching occurs in the step 104. Image matching is able to be performed in any manner such as comparing the images, and if the comparison results are above a threshold, then a match is established. Feature matching is performed in the step 106. Feature matching is able to be performed in any manner such as determining features in specific locations of a frame/image (e.g., edge), determining a feature based on surrounding pixels, and/or matching the features with a template. Structure is determined from motion in the step 108. Determining structure from motion involves estimating 3D structures from 2D image sequences based on local motion and is able to be performed in any manner such as using triangulation to calculation 3D positions of a subject from stereo pairs. A dense scene is prepared in the step 110. Preparing a dense scene is able to be implemented in any manner such as acquiring many points of data and/or filling in points to establish a dense scene. A depth map is generated in the step 112. There are many ways of generating a depth map such as combining global depth gradient and local depth refinement. The depth map is filtered in the step 114. Depth map filtering is able to be implemented in any manner such as using motion estimation, reconstruction and scene analysis. Meshing is implemented in the step 116. Meshing or mesh generation is able to be performed in any manner such as by establishing 3D surface patches to represent a set of connected triangles. Mesh filtering is performed in the step 118. Mesh filtering involves removing noise from a mesh and is able to be implemented in any manner such as utilizing an adaptive 3D convolution kernel applied to voxels of a distance transform model. Texturing is implemented in the step 120. Texturing includes applying a 2D texture to a 3D model and is able to be implemented in any manner. The steps are able to be performed sequentially, or parallelized and pipelined. In some embodiments, the order of the steps is modified. In some embodiments, fewer or additional steps are implemented.

Figure 2:
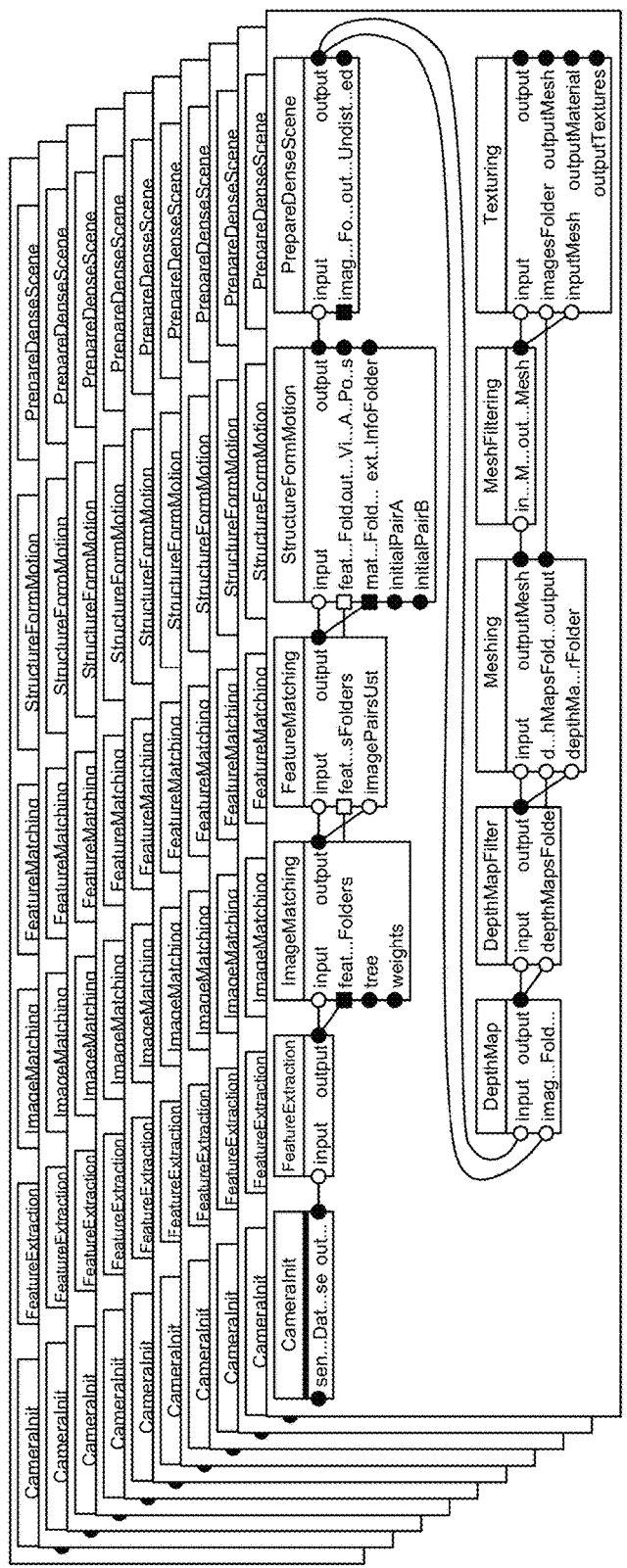
FIG. 2 illustrates an exemplary diagram of photogrammetry on a pipeline of 50 devices according to some embodiments.

FIG. 2 illustrates an exemplary diagram of photogrammetry on a pipeline of 50 devices according to some embodiments. By implementing a pipeline using many devices, the processing of the 3D data is much faster with minimal latency (e.g., less than 2 seconds). There are many other ways to parallelize the processing. In some embodiments, a local system includes 50 devices (or some other number of devices).

In some embodiments, every camera is paired with the hardware for AI and video processing. The hardware is able to be any device such as NVIDIA Jetson Xavier NX or NVIDIA Jetson Nano System on Modules (SOM) which are special accelerator hardware with CPU, GPU and AI capabilities. In some embodiments, each camera system is able to begin acquiring/processing a first set of frames. After a few milliseconds, another set of frames is acquired which can be offloaded to a different NX device (e.g., an available device), which enables pipelined processing.

Some of the steps of the photogrammetry pipeline are implemented locally (e.g., the camera/processing hardware setup), and some of the steps are implemented remotely (e.g., on a cloud device).

Figure 3:
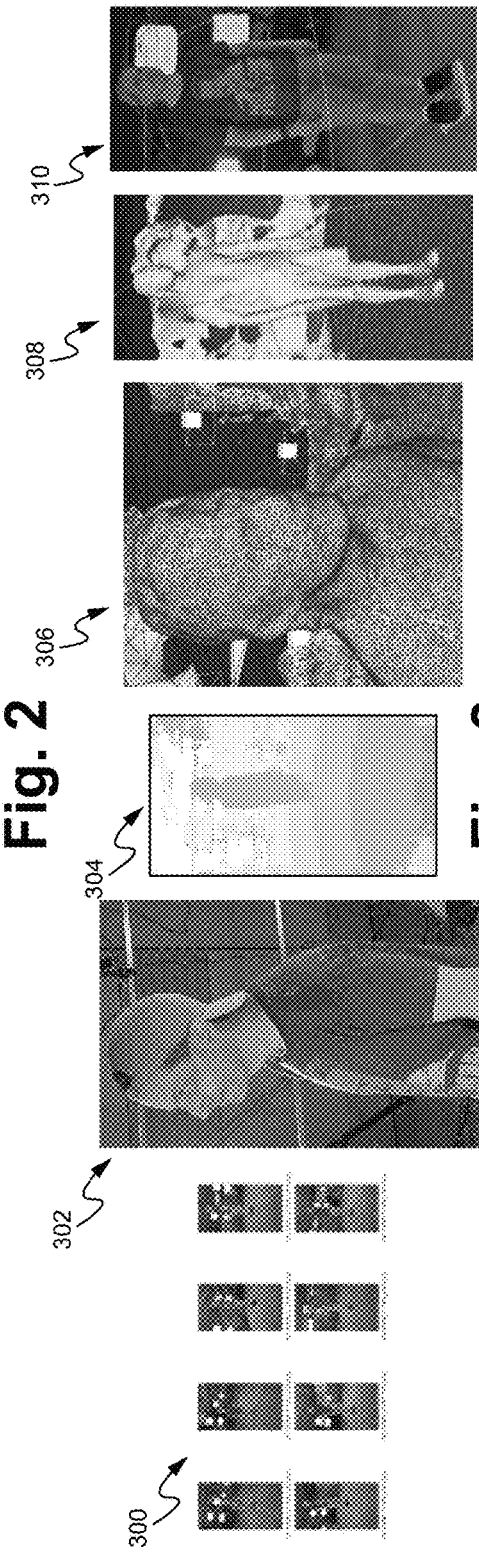
FIG. 3 illustrates exemplary images of volumetric 3D video processing aspects according to some embodiments.

FIG. 3 illustrates exemplary images of volumetric 3D video processing aspects according to some embodiments. Frames 300 include the Bayer data received from each camera. In some embodiments, the frames are from RGB images. Feature extraction 302 is implemented to extract features from the frames, which is 42 MB in this example. A depth map 304 (430 MB) is able to be generated. A mesh 306 (13 MB) is also able to be generated. Structure from motion 308 (2 MB) is able to be determined from the depth maps. Texturing 310 (80 MB) involves applying texture to the model to generate a 3D model. From one set of frames, it is possible to generate a 3D model.

Each of these steps (feature extraction through texturing) are able to be performed locally (and just transmit 3D models), or remotely (e.g., transmit all of the frames to the cloud for processing). There are significant drawbacks to limiting the process of processing only at one location, either locally or remotely.

Figure 4:
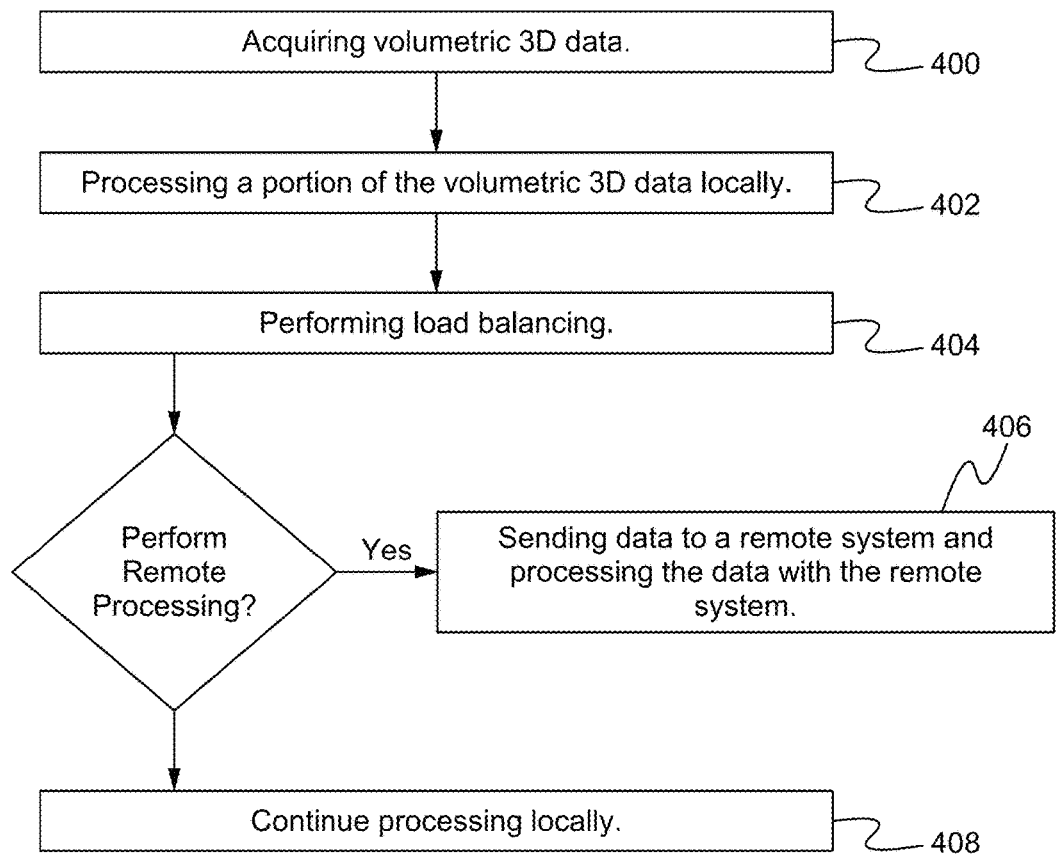
FIG. 4 illustrates a flowchart of a method of performing the hybrid implementation according to some embodiments.

FIG. 4 illustrates a flowchart of a method of performing the hybrid implementation according to some embodiments. In the step 400, volumetric 3D data is acquired. For example, one or more cameras are utilized to capture volumetric 3D data.

In the step 402, a portion of the volumetric 3D data is processed locally (e.g., on hardware connected to the camera devices). As described herein, there are many processing steps of the volumetric 3D data including, but not limited to: feature extraction, depth map generation, mesh generation, structure from motion generation, and texturing.

In the step 404, load balancing analysis is performed. Balancing analysis includes analyzing local processing/memory capabilities/availability, network bandwidth and remote processing/memory capabilities/availability. Any other aspects of local devices, remote devices or the network are able to be analyzed. The balancing analysis is able to be performed by a local device, a remote device or another device. For example, in a simple analysis, the amount of processing power on the local devices is compared with the amount of processing power on the remote devices, and the data is sent to the remote devices if the remote devices have higher processing power. More complex analysis is able to be performed such as prediction of processing power and availability, as well as historical analysis of the size of the current data to be processed and future data to be processed, and using all of this information to determine where data should be processed and what data is sent and where.

In the step 406, if the load balancing analysis indicates to perform remote processing, then the appropriate data is sent to a remote device/system (e.g., the cloud) for remote processing; otherwise, the processing continues locally, in the step 408. The load balancing analysis is able to occur continuously or at specific instances (e.g., after completion of mesh generation) to ensure the processing load is properly distributed among the local and remote devices. For example, if the current load at the local devices is at 100% and the load at the remote devices is at 0%, then the next set of data is sent to the remote devices for processing. In another example, if based on historical analysis, it has been determined that the local devices are capable to perform feature extraction and depth map generation, but become a bottleneck for mesh generation, then after depth map generation, the depth map and any accompanying data (e.g., compressed texture images) are sent to the remote devices for mesh generation, structure from motion generation and texturing to generate the 3D model. In another example, although historical analysis suggested transitioning to remote processing after depth map generation, the available network bandwidth is low, so the mesh generation is also performed locally which provides time for the network bandwidth to open up, and then the mesh and accompanying information is sent to the remote devices to finish the processing. In some embodiments, the order of the steps is modified. In some embodiments, fewer or additional steps are implemented.

The hybrid implementation described herein enables processing of the information locally and remotely. For example, feature extraction, depth map generation and mesh generation occur locally, and then the mesh information (and any other information) is sent to the cloud for remote processing (e.g., structure from motion processing and texture processing). In another example, if the CPU/GPU of the local device is not fast enough to perform the depth map generation, then the extracted features are able to be sent to the cloud for additional processing. The hybrid implementation is flexible in determining what information to process locally, what information to transmit to the cloud, and what information to process remotely (e.g., in the cloud). Based on the bandwidth, computing power/availability locally and computing power/availability remotely, the hybrid implementation is able to direct the processing of the data. For example, if the processing power and availability of the local devices is sufficient to handle processing feature extraction and depth map generation but not mesh generation and beyond, and a remote system has processing power and availability, and there is sufficient bandwidth to send the information for remote processing, then the generated depth map and any additional information are sent to the remote system (e.g., in the cloud) for processing. In another example, if the local devices have more capability/availability, then the mesh generation and structure from motion are able to be performed locally as well, and then the texturing is able to be performed locally based on the bandwidth of the network and the processing capability/availability of a remote system. The hybrid implementation is able to be configured to ensure real-time processing and transmission. The hybrid implementation is flexible and intelligent to determine what data to process where and when to send data where to maintain the real-time processing and transmission. The switching of where data is processed is able to happen dynamically and in real-time. Load balancing is able to be determined and implemented. Determining the load/availability is able to be based on metrics from CPU load, GPU load, memory load, and others as well as Artificial Intelligence (AI) accelerators perform AI to analyze the data including performing prediction analysis. In some embodiments, the local processing includes real-time compression.

Figure 5:
FIG. 5 illustrates a diagram of a hybrid implementation system according to some embodiments.

FIG. 5 illustrates a diagram of a hybrid implementation system according to some embodiments. A local processing device 500 is configured to perform processing locally. Processing is able to include any of the aspects of volumetric 3D data processing including, but not limited to: feature extraction, depth map generation, mesh generation, structure from motion generation, and texturing. In some embodiments, local or locally means connecting to a camera (or other device) without having to connect through the Internet. For example, a camera is directly connected to local processing hardware (e.g., a CPU/GPU/AI hardware such as NX or Nano). The local processing device 500 is able to include one or many devices. The local processing device 500 is also able to perform load balancing to determine where data should be processed. The processed information and other information are able to be communicated directly to a remote system 504 or over a network 502. The network is able to be any type of network such as a Local Area Network (LAN), the Internet, a wireless network, a wired network, a cellular network, and/or any other network or combination of networks. The remote system 504 is also able to process the volumetric 3D data and/or other data received. The remote system 504 is able to include one or more remote devices (e.g., in the cloud). In some embodiments, the remote system 504 or another device performs load balancing instead of the local processing device.

Figure 6:
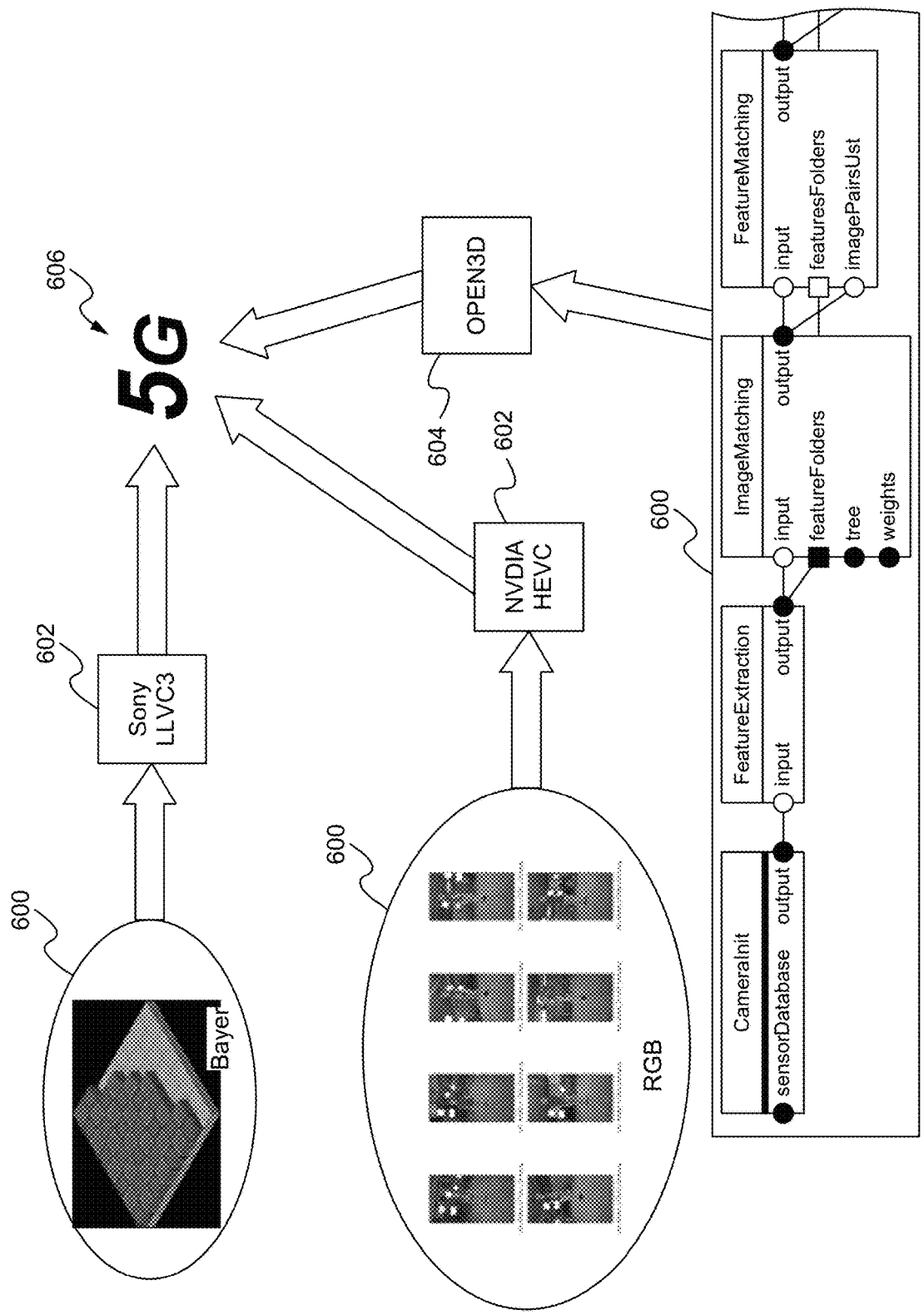
FIG. 6 illustrates a diagram of distributing data processing by the efficient hybrid implementation over a 5G network according to some embodiments.

FIG. 6 illustrates a diagram of distributing data processing by the efficient hybrid implementation over a 5G network according to some embodiments. The source data 600 is able to be Bayer information (e.g., raw data captured from camera sensors), RGB information, 3D/point cloud information, or any other information. Each of this source information is able to be processed using a real-time compression scheme 602 (e.g., LLVC3, HEVC) or library 604 (e.g., Open3D), which reduces the amount of data being transmitted (e.g., minimizes bandwidth usage), enabling the data to be transmitted in real-time on a 5G network 606.

FIG. 7 illustrates exemplary images of a volumetric 3D capture system and mesh according to some embodiments. Image 700 is an exemplary volumetric 3D capture system with multiple cameras (e.g., 4) configured to simultaneously capture images/videos of a subject. Image 702 shows the mesh generated from the captured 3D data.

In an exemplary implementation, eight synchronized cameras are utilized. The hardware synchronization of the cameras ensures that the frames are accurately synchronized.

Typically, to generate a mesh, very accurate and high detail images from a camera (or cameras) are used, which is a large amount of data. In previous implementations, that would mean a large amount of data must be transmitted to the cloud for processing which would utilize significant amounts of resources. However, if the mesh generation is performed locally using locally stored raw images, then the raw image information is not transmitted; rather, the mesh and compressed images (e.g., using HEVC) are able to be transmitted (e.g., for texture processing remotely). This significantly reduces the amount of data sent over the network which increases the speed that the data is sent. In other words, instead of transmitting very high quality images for processing in the cloud (e.g., for mesh generation), the feature extraction is performed locally, and mesh information is able to be generated locally and sent with compressed images (e.g., low resolution images) which are used for other processing.

Figure 8A:
FIGS. 8A-B illustrate exemplary diagrams of voxel reduction for fast transmission according to some embodiments.
Figure 8B:

FIGS. 8A-B illustrate exemplary diagrams of voxel reduction for fast transmission according to some embodiments. Low quality versions of the content are able to be transmitted, and later high quality versions of the content are transmitted. For example, a low quality version of content is streamed live initially, and then if bandwidth permits, a higher quality version of the content is streamed.

Figure 9:
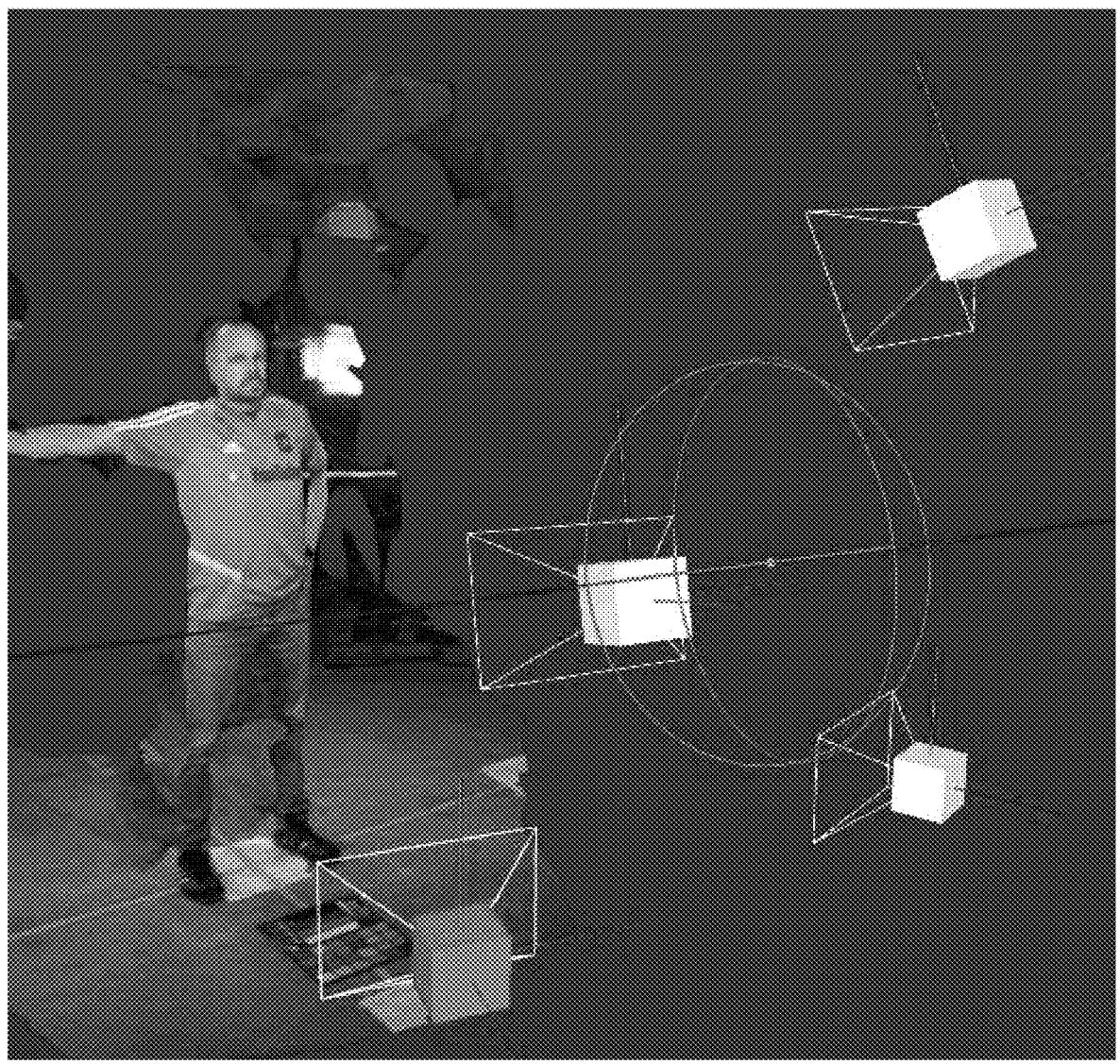
FIG. 9 illustrates a diagram of utilizing fewer or a variable number of devices according to some embodiments.

FIG. 9 illustrates a diagram of utilizing fewer or a variable number of devices according to some embodiments. In some implementations, the back side of a subject is not important, so fewer cameras are able to be utilized. Additionally, there is less data that is transmitted. Depending on the application, the hybrid implementation is able to determine how many frames and how many camera streams to process. If there is a change in view (e.g., a user selects to see from the back side), then the implementation is able to dynamically change the view. Having fewer streams is another aspect of the dynamic performance of the hybrid implementation. In some embodiments, instead of using fewer cameras, the same number of cameras are used, but content from some of the cameras is not processed. For example, a camera is configured to acquire volumetric 3D content of the back of a subject (in addition to cameras to acquire other sides of the subject), but while the view is of the front of the subject, the content of the back of the subject is not processed or is processed at a lower quality.

Figure 10:
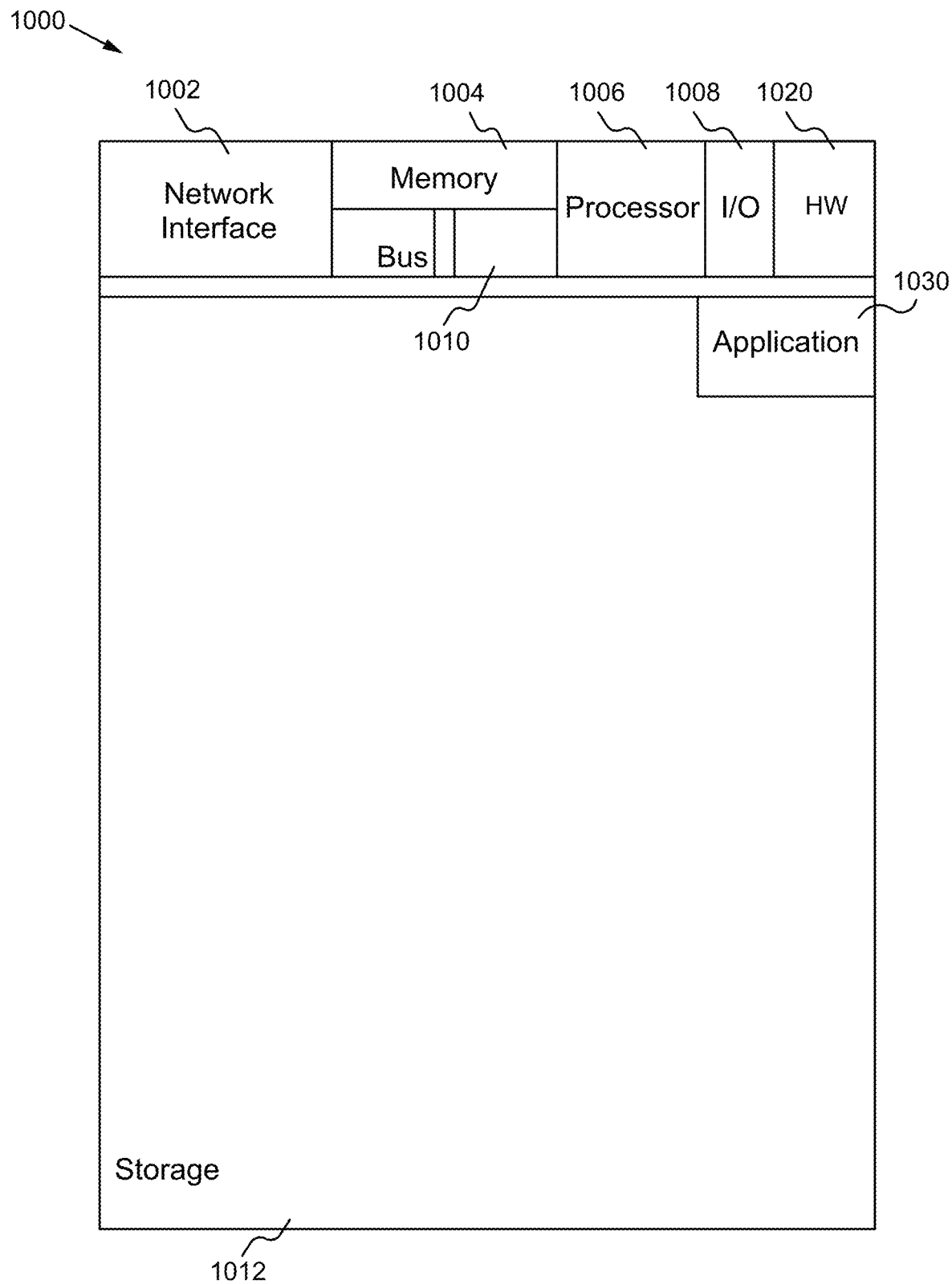
FIG. 10 illustrates a block diagram of an exemplary computing device configured to implement the hybrid compression method according to some embodiments.

FIG. 10 illustrates a block diagram of an exemplary computing device configured to implement the hybrid compression method according to some embodiments. The computing device 1000 is able to be used to acquire, store, compute, process, communicate and/or display information such as images and videos including 3D content. The computing device 1000 is able to implement any of the encoding/decoding aspects. In general, a hardware structure suitable for implementing the computing device 1000 includes a network interface 1002, a memory 1004, a processor 1006, I/O device(s) 1008, a bus 1010 and a storage device 1012. The choice of processor is not critical as long as a suitable processor with sufficient speed is chosen. A GPU is also able to be included. The memory 1004 is able to be any conventional computer memory known in the art. The storage device 1012 is able to include a hard drive, CDROM, CDRW, DVD, DVDRW, High Definition disc/ drive, ultra-HD drive, flash memory card or any other storage device. The computing device 1000 is able to include one or more network interfaces 1002. An example of a network interface includes a network card connected to an Ethernet or other type of LAN. The I/O device(s) 1008 are able to include one or more of the following: keyboard, mouse, monitor, screen, printer, modem, touchscreen, button interface and other devices. Hybrid compression application(s) 1030 used to implement the hybrid compression implementation are likely to be stored in the storage device 1012 and memory 1004 and processed as applications are typically processed. More or fewer components shown in FIG. 10 are able to be included in the computing device 1000. In some embodiments, hybrid compression hardware 1020 is included. Although the computing device 1000 in FIG. 10 includes applications 1030 and hardware 1020 for the hybrid compression implementation, the hybrid compression method is able to be implemented on a computing device in hardware, firmware, software or any combination thereof. For example, in some embodiments, the hybrid compression applications 1030 are programmed in a memory and executed using a processor. In another example, in some embodiments, the hybrid compression hardware 1020 is programmed hardware logic including gates specifically designed to implement the hybrid compression method.

In some embodiments, the hybrid compression application(s) 1030 include several applications and/or modules. In some embodiments, modules include one or more sub-modules as well. In some embodiments, fewer or additional modules are able to be included.

Examples of suitable computing devices include a personal computer, a laptop computer, a computer workstation, a server, a mainframe computer, a handheld computer, a personal digital assistant, a cellular/mobile telephone, a smart appliance, a gaming console, a digital camera, a digital camcorder, a camera phone, a smart phone, a portable music player, a tablet computer, a mobile device, a video player, a video disc writer/player (e.g., DVD writer/player, high definition disc writer/player, ultra high definition disc writer/ player), a television, a home entertainment system, an augmented reality device, a virtual reality device, smart jewelry (e.g., smart watch), a vehicle (e.g., a self-driving vehicle) or any other suitable computing device.

In some embodiments, the computing device is coupled to a camera or a camera system. In some embodiments, the device is stored locally, remotely or a combination thereof.

To utilize the hybrid compression method, devices perform load balancing such that acquired volumetric 3D information is processed locally and remotely in an optimized manner. The hybrid compression method is able to be implemented with user assistance or automatically without user involvement (e.g., by utilizing artificial intelligence).

In operation, the hybrid compression method enables more efficient volumetric 3D content processing and is able to reduce utilized network bandwidth compared to previous implementations.

Some Embodiments of Hybrid Edge-Cloud Compression of Volumetric 3D Data for Efficient 5G Transmission 1. A method comprising:
   acquiring volumetric 3D data with a plurality of camera devices;
   processing a first portion of the volumetric 3D data with a local device;
   analyzing a first set of load information of the local device, a second set of load information of a remote device, and network bandwidth information;
   processing a second portion of the volumetric 3D data with a remote device based on the analysis of the first set of load information of the local device, the second set of load information of the remote device, and the network bandwidth information.

2. The method of clause 1 wherein processing the volumetric 3D data comprises at least one of feature extraction, depth map generation, mesh generation, structure from motion generation, and texturing.
3. The method of clause 1 wherein processing the first portion of the volumetric 3D data with the local device and processing the second portion of the volumetric 3D data with the remote device utilizes pipelining.
4. The method of clause 1 further comprising determining when to send the second portion of the volumetric 3D data and accompanying data to the remote device using artificial intelligence.
5. The method of clause 4 wherein determining when to send the second portion of the volumetric 3D data and the accompanying data is based on the second set of load information of the remote device being greater than the first set of load information of the local device.
6. The method of clause 4 wherein determining when to send the second portion of the volumetric 3D data and the accompanying data includes continuously analyzing the first set of load information of the local device, the second set of load information of the remote device, and the network bandwidth information.
7. The method of clause 4 wherein determining when to send the second portion of the volumetric 3D data and the accompanying data includes analyzing the first set of load information of the local device, the second set of load information of the remote device, and the network bandwidth information after completion of a specific stage of processing the volumetric 3D data.
8. The method of clause 1 further comprising implementing real-time compression of the volumetric 3D data.
9. An apparatus comprising:
a non-transitory memory for storing an application, the application for:
processing a first portion of a volumetric 3D data;
sending a second portion of the volumetric 3D data to a remote device based on analysis of a first set of load information of the apparatus, a second set of load information of the remote device, and network bandwidth information; and
a processor coupled to the memory, the processor configured for processing the application.
10. The apparatus of clause 9 wherein the application is further configured for acquiring volumetric 3D data from a plurality of camera devices.
11. The apparatus of clause 9 wherein the application is further configured for analyzing the first set of load information of the apparatus, the second set of load information of a remote device, and the network bandwidth information.
12. The apparatus of clause 9 wherein processing the first portion of the volumetric 3D data comprises at least one of feature extraction, depth map generation, mesh generation, structure from motion generation, and texturing.
13. The apparatus of clause 9 wherein the application is further configured for determining when to send the second portion of the volumetric 3D data and accompanying data to the remote device using artificial intelligence.
14. The apparatus of clause 13 wherein determining when to send the second portion of the volumetric 3D data and the accompanying data is based on the second set of load information of the remote device being greater than the first set of load information of the local device.
15. The apparatus of clause 13 wherein determining when to send the second portion of the volumetric 3D data and the accompanying data includes continuously analyzing the first set of load information of the local device, the second set of load information of the remote device, and the network bandwidth information.
16. The apparatus of clause 13 wherein determining when to send the second portion of the volumetric 3D data and the accompanying data includes analyzing the first set of load information of the local device, the second set of load information of the remote device, and the network bandwidth information after completion of a specific stage of processing the volumetric 3D data.
17. The apparatus of clause 9 wherein the application is further configured for implementing real-time compression of the volumetric 3D data.
18. An apparatus comprising:
a non-transitory memory for storing an application, the application for:
receiving a portion of volumetric 3D data from a local device based on analysis of a first set of load information of the apparatus, a second set of load information of the remote device, and network bandwidth information; and
processing the portion of the volumetric 3D data; and
a processor coupled to the memory, the processor configured for processing the application.
19. The apparatus of clause 18 wherein the application is further configured for analyzing the first set of load information of the apparatus, the second set of load information of a remote device, and the network bandwidth information.
20. The apparatus of clause 18 wherein processing the portion of the volumetric 3D data comprises at least one of feature extraction, depth map generation, mesh generation, structure from motion generation, and texturing.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:
1. A method comprising:
acquiring volumetric 3D data with a plurality of camera devices;
processing a first portion of the volumetric 3D data with a local device;
analyzing a first set of load information of the local device, a second set of load information of a remote device, and network bandwidth information; and
processing a second portion of the volumetric 3D data with a remote device based on the analysis of the first set of load information of the local device, the second set of load information of the remote device, and the network bandwidth information, wherein processing the first portion of the volumetric 3D data comprises determining structure from motion by estimating one or more 3D structures from 2D image sequences based on local motion using triangulation to calculate 3D positions of a subject from stereo pairs.
2. The method of claim 1 wherein processing the volumetric 3D data comprises at least one of feature extraction, depth map generation, mesh generation, and texturing.

3. The method of claim 1 wherein processing the first portion of the volumetric 3D data with the local device and processing the second portion of the volumetric 3D data with the remote device utilizes pipelining.

4. The method of claim 1 further comprising determining when to send the second portion of the volumetric 3D data and accompanying data to the remote device using artificial intelligence.

5. The method of claim 4 wherein determining when to send the second portion of the volumetric 3D data and the accompanying data is based on the second set of load information of the remote device being greater than the first set of load information of the local device.

6. The method of claim 4 wherein determining when to send the second portion of the volumetric 3D data and the accompanying data includes continuously analyzing the first set of load information of the local device, the second set of load information of the remote device, and the network bandwidth information.

7. The method of claim 4 wherein determining when to send the second portion of the volumetric 3D data and the accompanying data includes analyzing the first set of load information of the local device, the second set of load information of the remote device, and the network bandwidth information after completion of a specific stage of processing the volumetric 3D data.

8. The method of claim 1 further comprising implementing real-time compression of the volumetric 3D data.

9. An apparatus comprising:
a non-transitory memory for storing an application, the application for:
processing a first portion of a volumetric 3D data; and
sending a second portion of the volumetric 3D data to a remote device based on analysis of a first set of load information of the apparatus, a second set of load information of the remote device, and network bandwidth information, wherein processing the first portion of the volumetric 3D data comprises determining structure from motion by estimating one or more 3D structures from 2D image sequences based on local motion using triangulation to calculate 3D positions of a subject from stereo pairs; and
a processor coupled to the memory, the processor configured for processing the application.

10. The apparatus of claim 9 wherein the application is further configured for acquiring volumetric 3D data from a plurality of camera devices.

11. The apparatus of claim 9 wherein the application is further configured for analyzing the first set of load information of the apparatus, the second set of load information of a remote device, and the network bandwidth information.

12. The apparatus of claim 9 wherein processing the first portion of the volumetric 3D data comprises at least one of feature extraction, depth map generation, mesh generation, and texturing.

13. The apparatus of claim 9 wherein the application is further configured for determining when to send the second portion of the volumetric 3D data and accompanying data to the remote device using artificial intelligence.

14. The apparatus of claim 13 wherein determining when to send the second portion of the volumetric 3D data and the accompanying data is based on the second set of load information of the remote device being greater than the first set of load information of the local device.

15. The apparatus of claim 13 wherein determining when to send the second portion of the volumetric 3D data and the accompanying data includes continuously analyzing the first set of load information of the local device, the second set of load information of the remote device, and the network bandwidth information.

16. The apparatus of claim 13 wherein determining when to send the second portion of the volumetric 3D data and the accompanying data includes analyzing the first set of load information of the local device, the second set of load information of the remote device, and the network bandwidth information after completion of a specific stage of processing the volumetric 3D data.

17. The apparatus of claim 9 wherein the application is further configured for implementing real-time compression of the volumetric 3D data.

18. An apparatus comprising:
a non-transitory memory for storing an application, the application for:
receiving a portion of volumetric 3D data from a local device based on analysis of a first set of load information of the apparatus, a second set of load information of the remote device, and network bandwidth information; and
processing the portion of the volumetric 3D data, wherein processing the portion of the volumetric 3D data comprises determining structure from motion by estimating one or more 3D structures from 2D image sequences based on local motion using triangulation to calculate 3D positions of a subject from stereo pairs; and
a processor coupled to the memory, the processor configured for processing the application.

19. The apparatus of claim 18 wherein the application is further configured for analyzing the first set of load information of the apparatus, the second set of load information of a remote device, and the network bandwidth information.

20. The apparatus of claim 18 wherein processing the portion of the volumetric 3D data comprises at least one of feature extraction, depth map generation, mesh generation, and texturing.

* * * * *